(12) United States Patent
Wu

(10) Patent No.: US 8,593,248 B2
(45) Date of Patent: *Nov. 26, 2013

(54) INDUCTOR

(71) Applicant: Cyntec Co., Ltd., Hsin-Chu (TW)

(72) Inventor: Tsung-Chan Wu, Hsinchu County (TW)

(73) Assignee: Cyntec Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/681,394

(22) Filed: Nov. 19, 2012

(65) Prior Publication Data

US 2013/0076470 A1   Mar. 28, 2013

Related U.S. Application Data

(63) Continuation of application No. 13/176,763, filed on Jul. 6, 2011, now Pat. No. 8,339,229.

(30) Foreign Application Priority Data

Jan. 4, 2011   (TW) .............................. 100100181 A

(51) Int. Cl.
*H01F 5/00* (2006.01)

(52) U.S. Cl.
USPC ........................................................ 336/200

(58) Field of Classification Search
USPC .............................. 336/65, 83, 192, 200, 212
See application file for complete search history.

(56) References Cited

U.S. PATENT DOCUMENTS

| | | | |
|---|---|---|---|
| 5,010,314 A * | 4/1991 | Estrov ........................... | 336/198 |
| 5,469,334 A | 11/1995 | Balakrishnan | |
| 7,339,451 B2 | 3/2008 | Liu | |
| 7,446,637 B1 | 11/2008 | Liang | |
| 7,477,122 B2 | 1/2009 | Iguchi | |
| 7,884,692 B2 * | 2/2011 | Yen et al. ........................ | 336/90 |
| 8,289,121 B2 * | 10/2012 | Yan et al. ....................... | 336/221 |
| 2006/0186978 A1 | 8/2006 | Kawarai | |
| 2007/0075816 A1 | 4/2007 | Lotfi | |
| 2008/0309442 A1 | 12/2008 | Hebert | |
| 2008/0309443 A1 | 12/2008 | Furuya | |
| 2009/0059546 A1 | 3/2009 | Xing | |
| 2009/0160595 A1 | 6/2009 | Feng | |

FOREIGN PATENT DOCUMENTS

| | | |
|---|---|---|
| CN | 201207320 | 3/2009 |
| JP | 383909 | 8/1991 |
| JP | 2005150470 | 6/2005 |
| JP | 2006196731 | 7/2006 |
| JP | 2009200435 | 9/2009 |

* cited by examiner

*Primary Examiner* — Tuyen Nguyen

(74) *Attorney, Agent, or Firm* — Litron Patent & Trademark Office; Min-Lee Teng

(57) ABSTRACT

An inductor includes a first core, a conducting wire, a second core and a first lead frame. There is an accommodating space formed on a first side of the first core and there is a recess portion formed on a second side of the first core, wherein the first side is opposite to the second side. The first core has a first height. The conducting wire is disposed in the accommodating space. The second core is disposed on the first side of the first core and covers the accommodating space. The first lead frame has an embedded portion embedded in the recess portion. The embedded portion has a second height. After embedding the embedded portion in the recess portion of the first core, a total height of the embedded portion and the first core is smaller than the sum of the first height and the second height.

20 Claims, 11 Drawing Sheets

INDUCTOR

CROSS REFERENCE TO RELATED APPLICATIONS

This is a Continuation application of Ser. No. 13/176,763, now pending, filed on Jul. 6, 2011.

BACKGROUND OF THE INVENTION

1. Field of the Invention

The invention relates to an inductor and, more particularly, to an inductor adapted to be integrated with an integrated circuit (IC) chip by system-in-package (SIP) technology.

2. Description of the Prior Art

An inductor is a passive electrical component that can store energy in a magnetic field created by the electric current passing through it. An inductor's ability to store magnetic energy is measured by its inductance. Typically an inductor is a conducting wire shaped as a coil, the loops helping to create a strong magnetic field inside the coil due to Faraday's Law of Induction. Inductance is an effect resulting from the magnetic field that forms around a current-carrying conductor which tends to resist changes in the current. The number of loops, the size of each loop, and the material it is wrapped around all affect the inductance. For example, the magnetic flux linking these turns can be increased by coiling the conductor around a material with a high permeability such as ferrite magnetism.

So far there are various types of inductors disclosed in the prior arts. For example, a drum type of inductor is disclosed in Japanese patent No. 3-83909, another drum type of inductor is disclosed in U.S. Pat. No. 7,477,122, and a compact power semiconductor package with stacked inductor and integrated circuit die is disclosed in U.S. published application No. 20090160595. In general, most of the conventional inductors are integrated with an IC chip by two manners depicted in the following.

The first manner is that a lead is extended from a lower core of an inductor so as to be welded on a welding foot of a circuit board. However, in order to keep specific structure strength, the lower core must have a specific thickness, such that the total height of the inductor integrated with the IC chip will increase.

The second manner is that an external lead frame is connected under a lower core of an inductor so as to be welded on a lead frame of an IC chip. However, the height of the external lead frame will make the total height of the inductor integrated with the IC chip increase.

Thus, if the inductance has to be kept in a specific value, the total height of the conventional inductor integrated with the IC chip cannot be reduced, such that it cannot be adapted to a thin design.

SUMMARY OF THE INVENTION

Therefore, one objective of the invention is to provide an inductor with a conducting wire embedded in a core. When the inductor is integrated with an IC chip by system-in-package technology, the total height can be reduced effectively, such that an electronic product can be adapted to a thin design.

Another objective of the invention is to provide an inductor utilizing a lead frame to provide a platform for welding a conducting wire, so as to obtain high welding strength.

According to one embodiment, an inductor of the invention comprises a first core, a conducting wire, a second core and a first lead frame. An accommodating space is formed on a first side of the first core and a recess portion is formed on a second side of the first core, wherein the first side is opposite to the second side. The first core has a first height. The conducting wire is disposed in the accommodating space. The second core is disposed on the first side of the first core and covers the accommodating space. The first lead frame has an embedded portion embedded in the recess portion. The embedded portion has a second height. After embedding the embedded portion in the recess portion, a total height of the embedded portion and the first core is smaller than a sum of the first height and the second height.

According to another embodiment, an inductor of the invention comprises a first core, a conducting wire, a second core and a first lead frame. An accommodating space is formed on a first side of the first core and a recess portion is formed on a second side of the first core, wherein the first side is opposite to the second side. A hole is formed on an edge of the first core. The conducting wire is disposed in the accommodating space. The second core is disposed on the first side of the first core and covers the accommodating space. The first lead frame has an embedded portion and a welding platform, the embedded portion is embedded in the recess portion, and the welding platform is connected to the embedded portion. One end of the conducting wire passes through the hole and is welded on the welding platform.

According to another embodiment, an inductor of the invention comprises a first core, a conducting wire, a second core and a first lead frame. An accommodating space is formed on a first side of the first core and a recess portion is formed on a second side of the first core, wherein the first side is opposite to the second side. A hole is formed on a corner of the first core. The conducting wire is disposed in the accommodating space. The second core is disposed on the first side of the first core and covers the accommodating space. The first lead frame has an embedded portion embedded in the recess portion. One end of the conducting wire passes through the hole and is welded on the embedded portion.

As mentioned in the above, since the invention embeds the conducting wire into the core, the total height can be reduced effectively when the inductor is integrated with an IC chip by system-in-package technology. Accordingly, the electronic product equipped with the inductor of the invention can be adapted to a thin design. Furthermore, the inductor of the invention utilizes the lead frame to provide a platform for welding the conducting wire, so as to obtain high welding strength.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
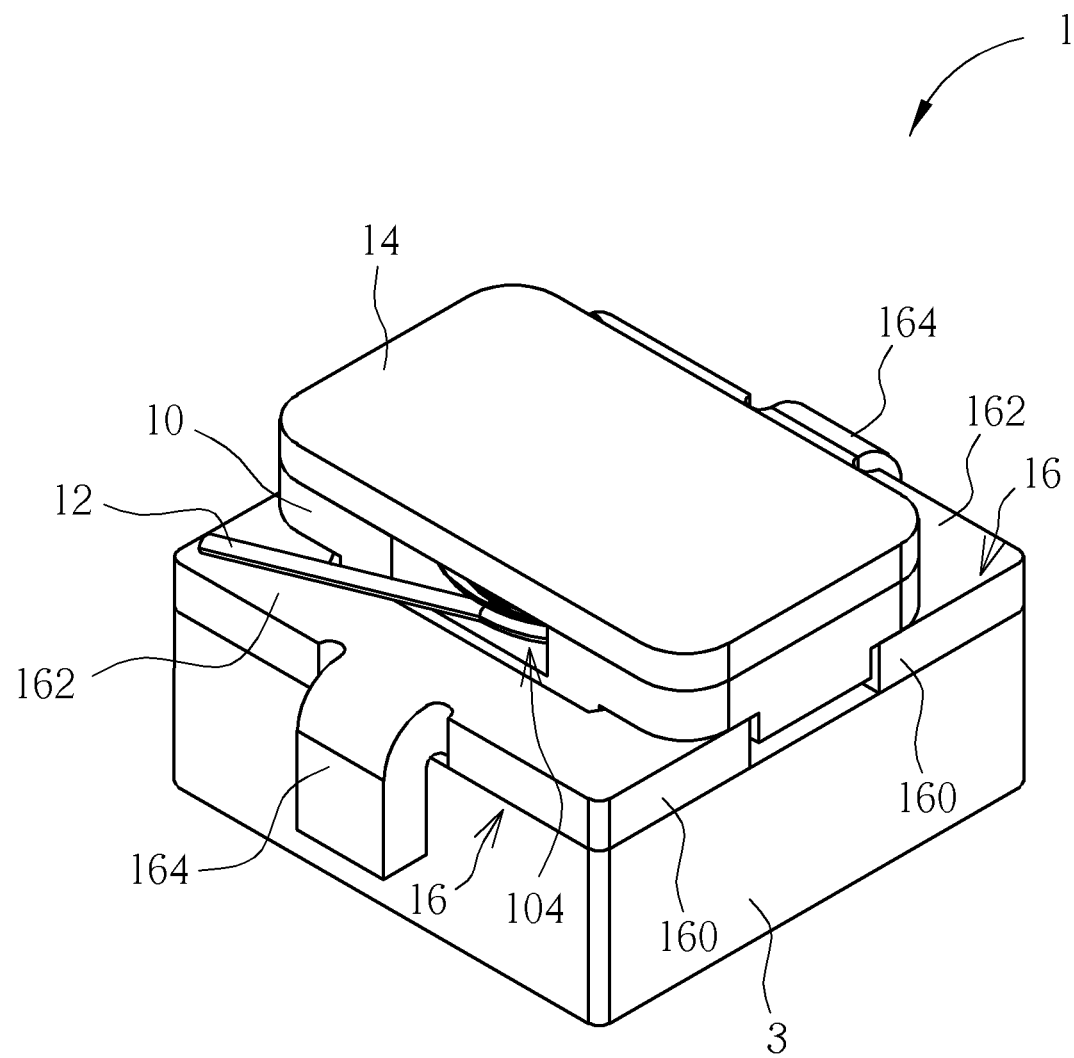
FIG. 1 is a schematic diagram illustrating an assembly of an inductor and an IC chip package structure according to one embodiment of the invention.
Figure 2:
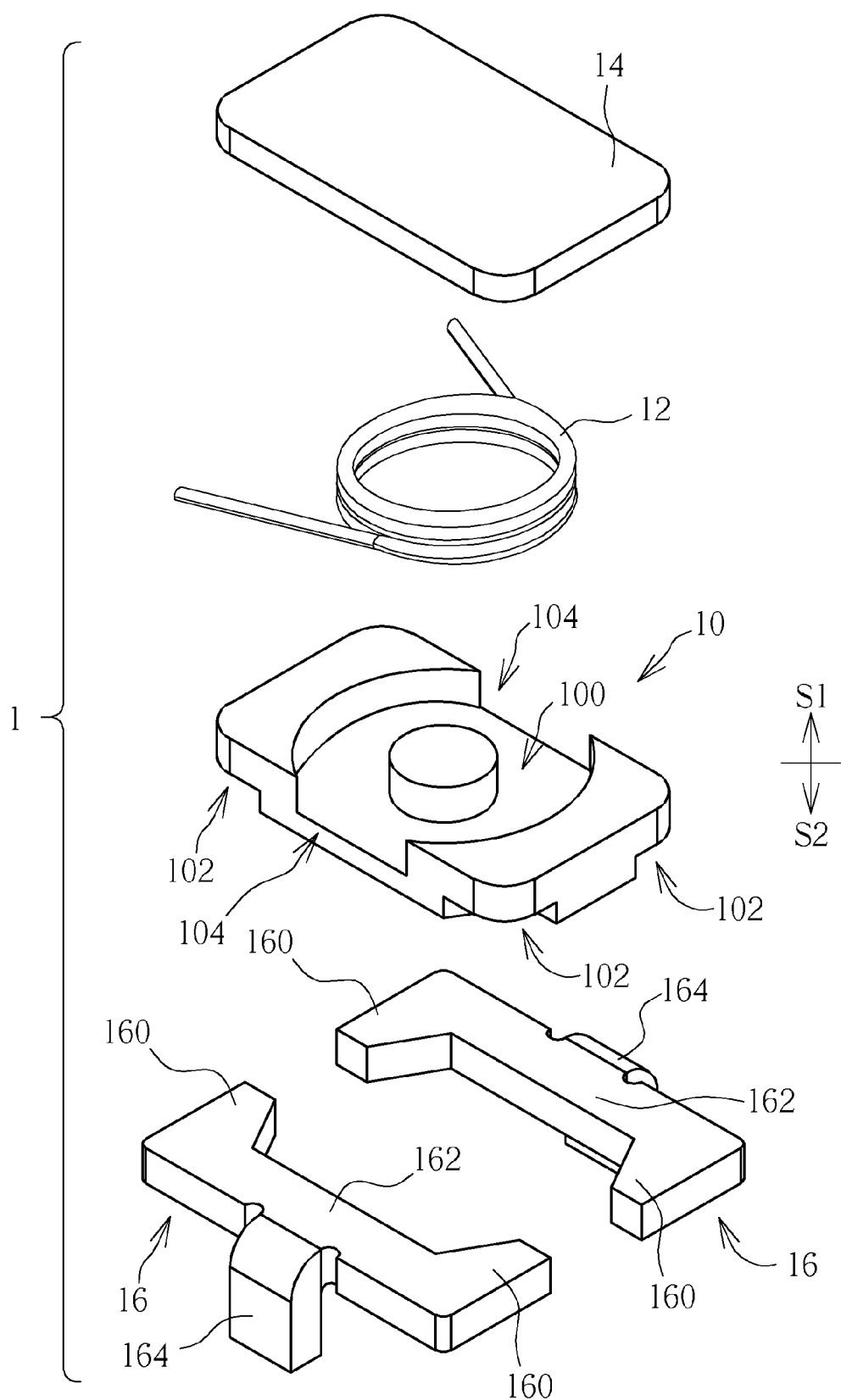
FIG. 2 is an exploded view illustrating the inductor shown in FIG. 1.
Figure 3:
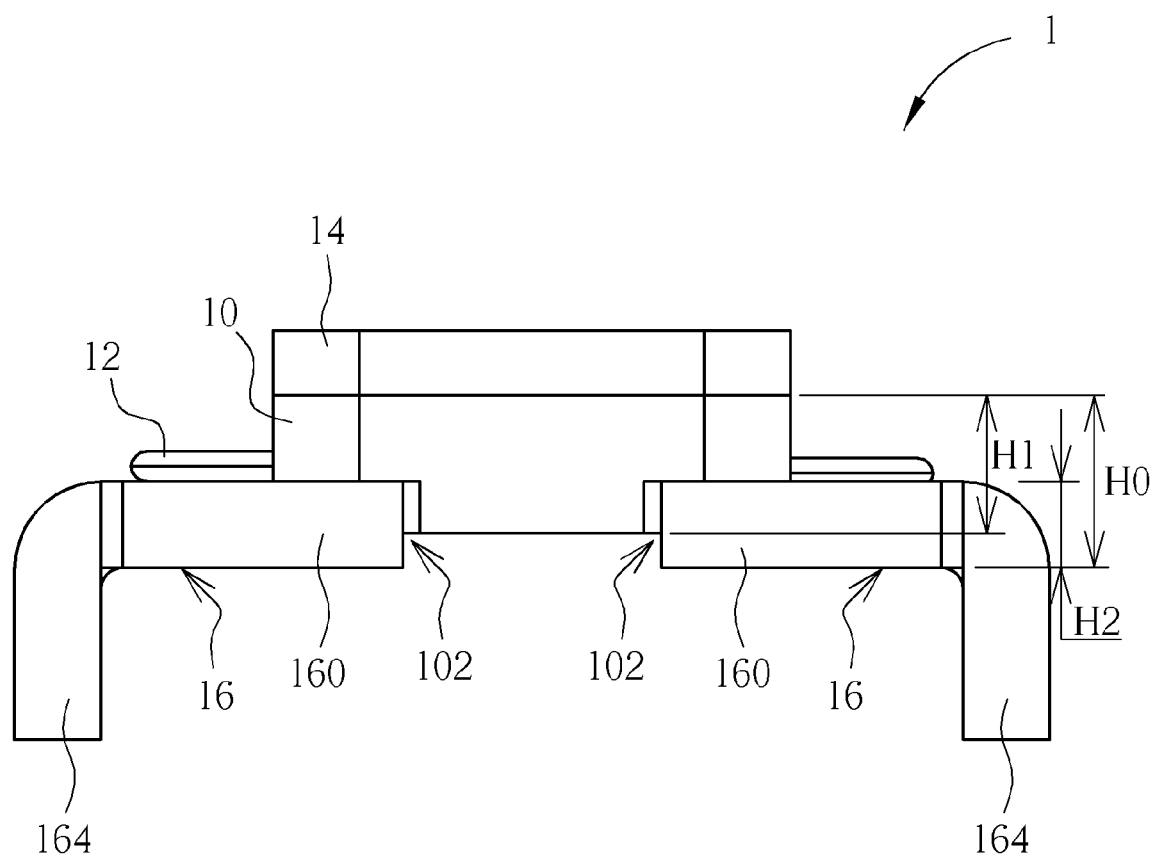
FIG. 3 is a front view illustrating the inductor shown in FIG. 1.

Referring to FIGS. 1 to 3, FIG. 1 is a schematic diagram illustrating an assembly of an inductor 1 and an IC chip package structure 3 according to one embodiment of the invention, FIG. 2 is an exploded view illustrating the inductor 1 shown in FIG. 1, and FIG. 3 is a front view illustrating the inductor 1 shown in FIG. 1. As shown in FIGS. 1 to 3, the inductor 1 comprises a first core 10, a conducting wire 12, a second core 14 and two first lead frames 16. The first core 10 or the second core 14 may be made of iron powder, ferrite, permanent magnet or other magnetic materials. The shape of the first core 10 or the second core 14 is not limited to rectangular as shown in the figures and may be designed in other shapes, such as circular, oval-shaped, polygonal, and soon, according to practical applications. The conducting wire 12 may be a wire-wound coil wound by copper wire.

As shown in FIG. 2, an accommodating space 100 is formed on a first side S1 of the first core 10 and four recess portions 102 are formed on a second side S2 of the first core 10 (there are only three recess portions 102 shown in FIG. 2 due to the view angle), wherein the first side S1 is opposite to the second side S2. In this embodiment, the four recess portions 102 are formed on four corners of the first core 10 respectively, such that the area utilization ratio of the accommodating space 100 can be improved effectively. In this embodiment, each of the two first lead frames 16 has two opposite embedded portions 160, a welding platform 162 and a lead 164, wherein the welding platform 162 is connected between the two embedded portions 160 and the lead 164 is extended from the welding platform 162. In practical applications, the first lead frame 16 may be formed by forging process.

To assemble the inductor 1, the conducting wire 12 has to be disposed in the accommodating space 100 first. Afterward, the second sore 14 is disposed on the first side S1 of the first core 10 and covers the accommodating space 100. Then, the embedded portions 160 of each first lead frame 16 are embedded in the recess portions 102 on the second side S2 of the first core 10 correspondingly. In this embodiment, two holes 104 are formed on two opposite edges of the first core 10 respectively, so two opposite ends of the conducting wire 12 can pass through the holes 104 and be welded on the welding platforms 162 of the first lead frames 16 respectively, so as to obtain high welding strength.

As shown in FIG. 3, the first core 10 has a first height H1 and the embedded portion 160 of the first lead frame 16 has a second height H2. After embedding the embedded portion 160 of the first lead frame 16 in the recess portion 102 of the first core 10, a total height H0 of the embedded portion 160 and the first core 10 is smaller than a sum of the first height H1 and the second height H2.

As shown in FIG. 1, when the inductor 1 is integrated with the IC chip package structure 3 by system-in-package technology, the first lead frames 16 can be used to form an air bridge and connected to electrical pads (not shown) of the IC chip package structure 3. In this embodiment, the IC chip package structure 3 may be manufactured by using an encapsulation gel to encapsulate an IC chip and lead frame thereof. Since IC chip package technology is well known by one skilled in the art, it will not be depicted in detail herein. As mentioned in the above, since the total height H0 of the embedded portion 160 and the first core 10 is smaller than a sum of the first height H1 of the first core 10 and the second height H2 of the embedded portion 160 and the conducting wire 12 is embedded in the accommodating space 100 of the first core 10, the invention can satisfy the requirement of inductance without increasing the height of the inductor 1 and can improve the connection between the IC chip package structure 3 and the inductor 1.

In this embodiment, the lead 164 of the first lead frame 16 has a longitudinal shape and extends downward so as to be connected to electrical pad of the IC chip package structure 3. However, in another embodiment, a lead of the IC chip package structure 3 may be extended upward so as to be connected to the lead frame 16. Furthermore, an external lead may be used to connect the first lead frame 16 of the inductor 1 and the electrical pad of the IC chip package structure 3. In other words, the connecting manner between the first lead frame 16 and the IC chip package structure 3 may be designed based on practical applications and not limited to the embodiment shown in the figures.

Figure 4:
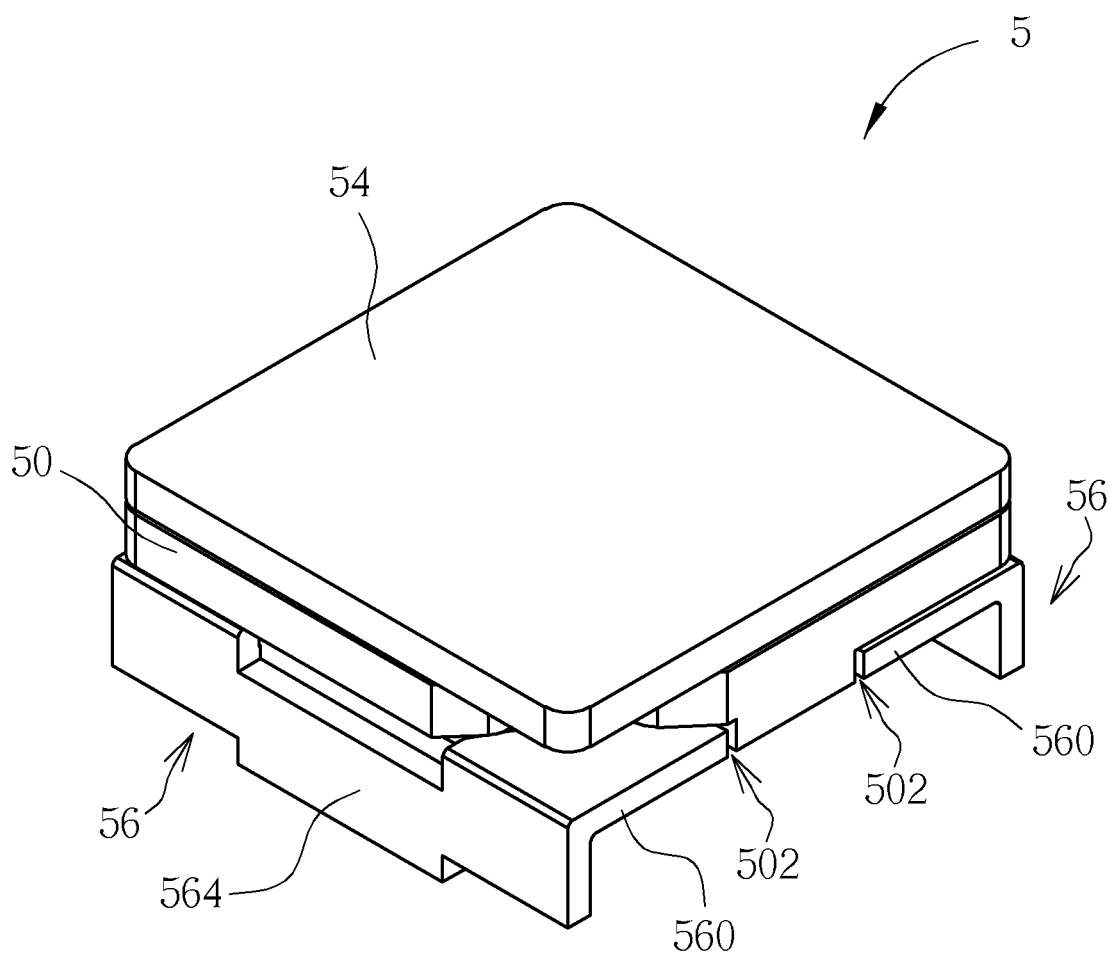
FIG. 4 is a perspective view illustrating an inductor according to another embodiment of the invention.
Figure 5:
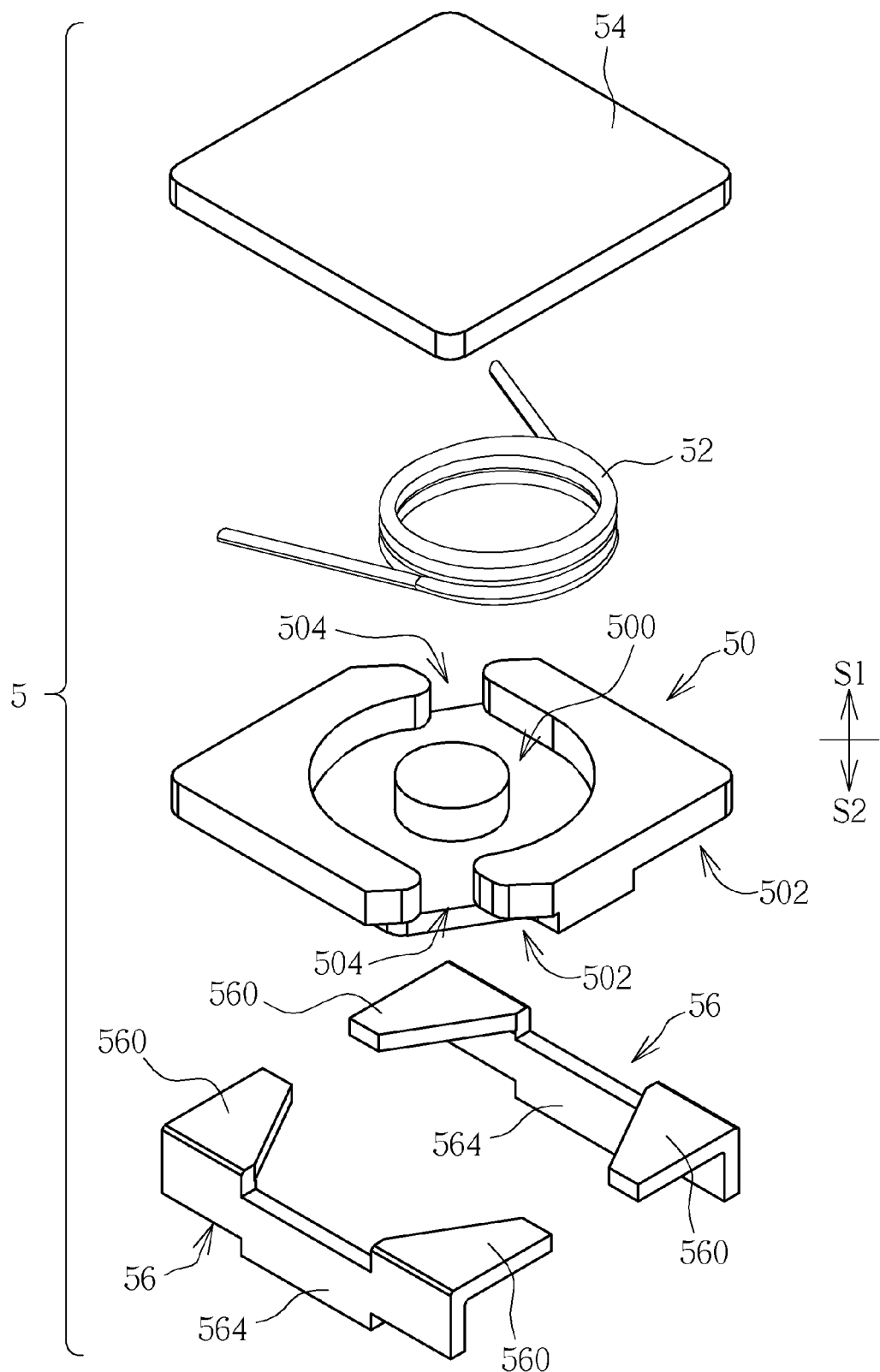
FIG. 5 is an exploded view illustrating the inductor shown in FIG. 4.
Figure 6:
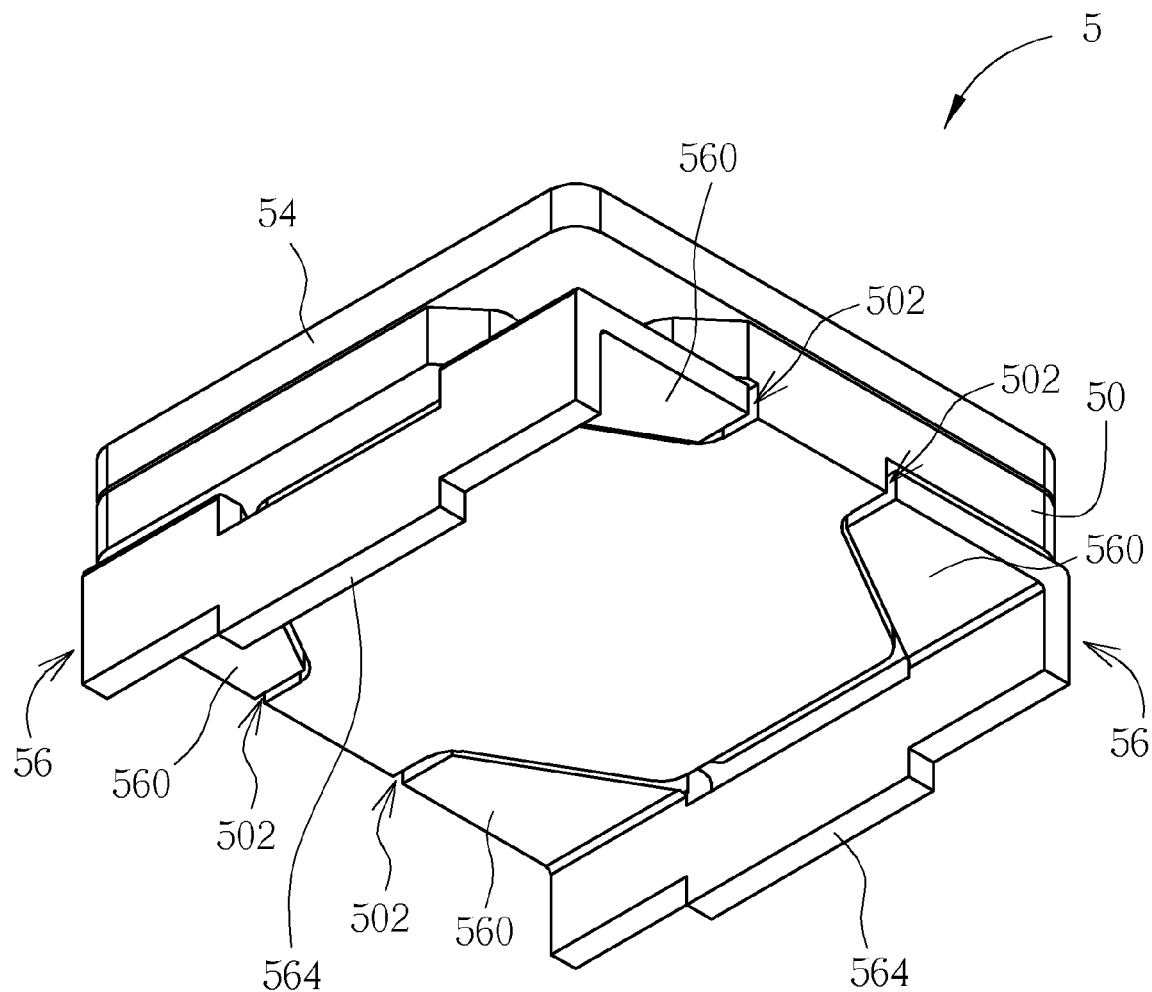
FIG. 6 is a perspective view illustrating the inductor shown in FIG. 4 from another view angle.
Figure 7:
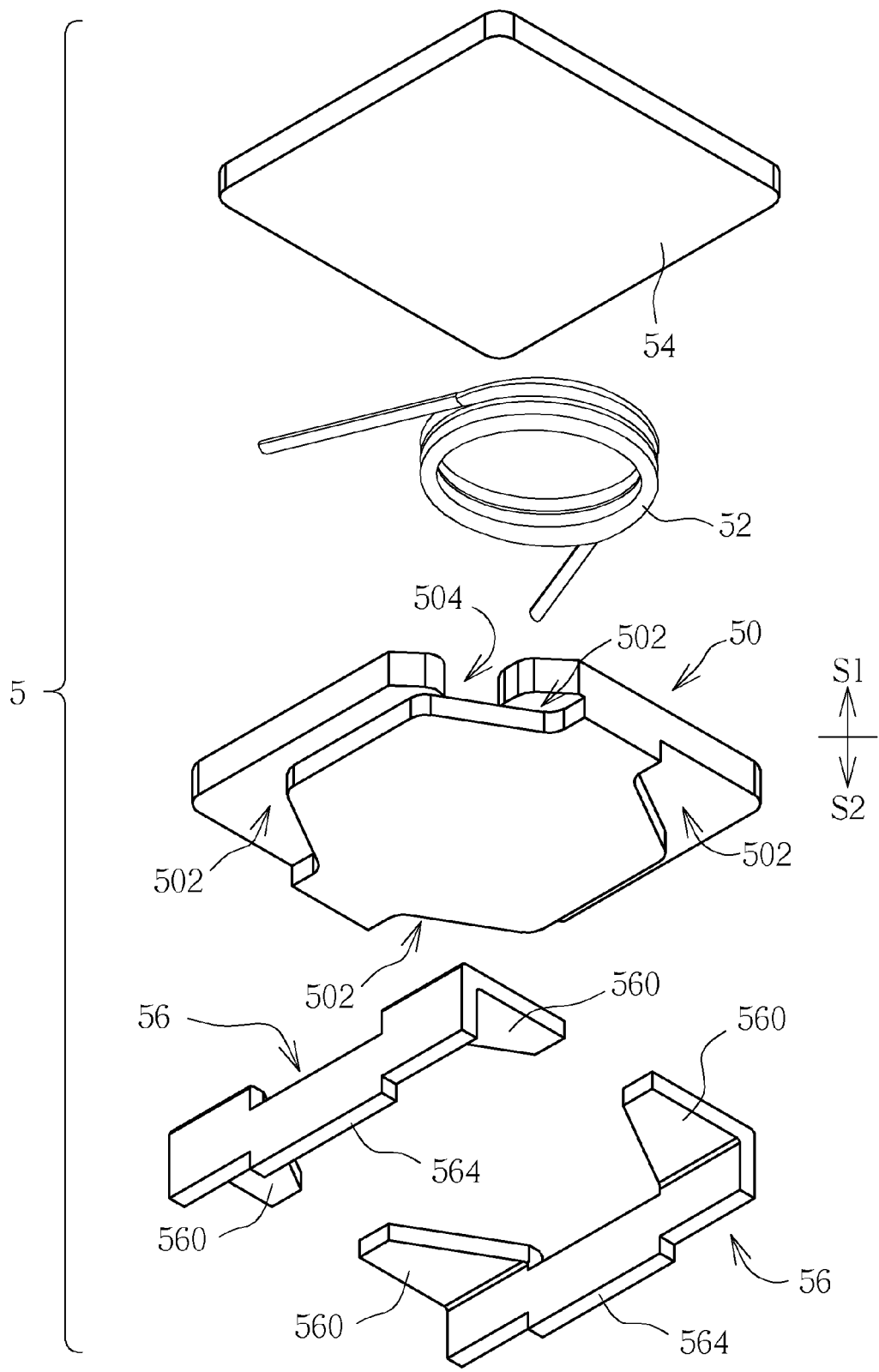
FIG. 7 is an exploded view illustrating the inductor shown in FIG. 6.
Figure 8:
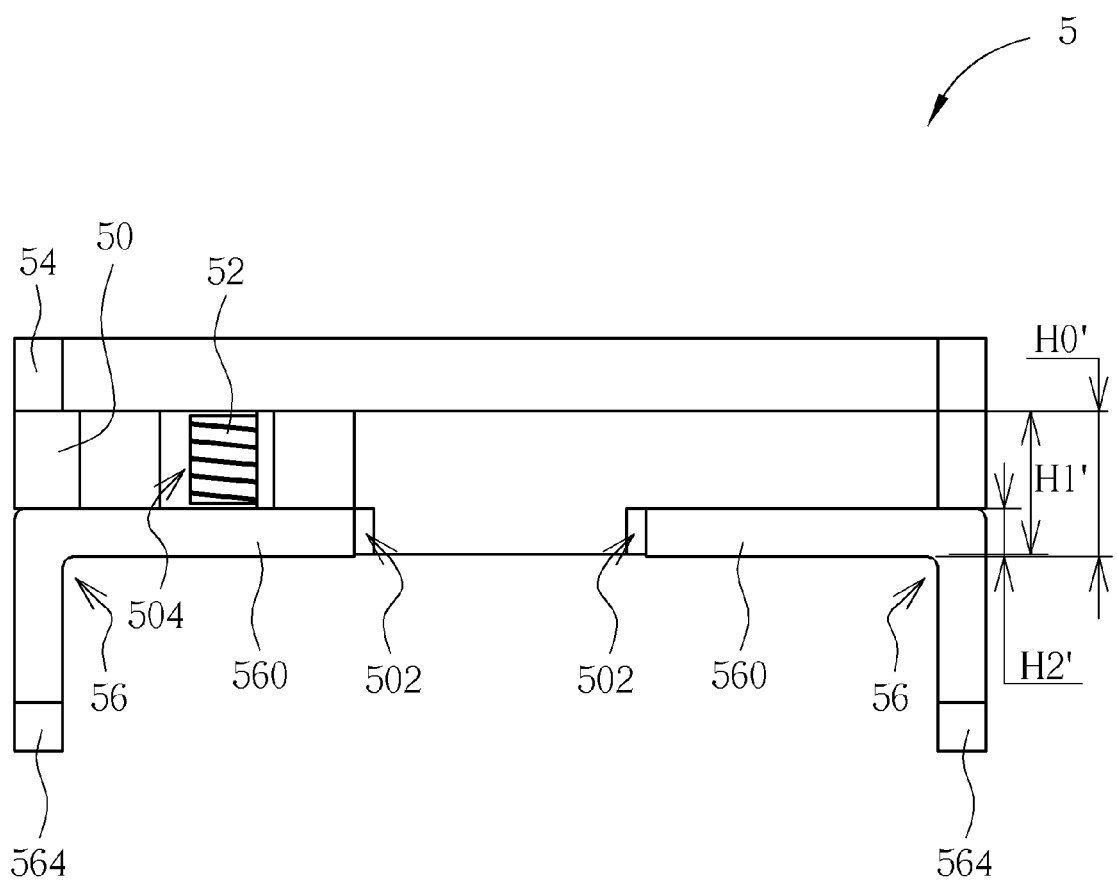
FIG. 8 is a front view illustrating the inductor shown in FIG. 4.
Figure 9:
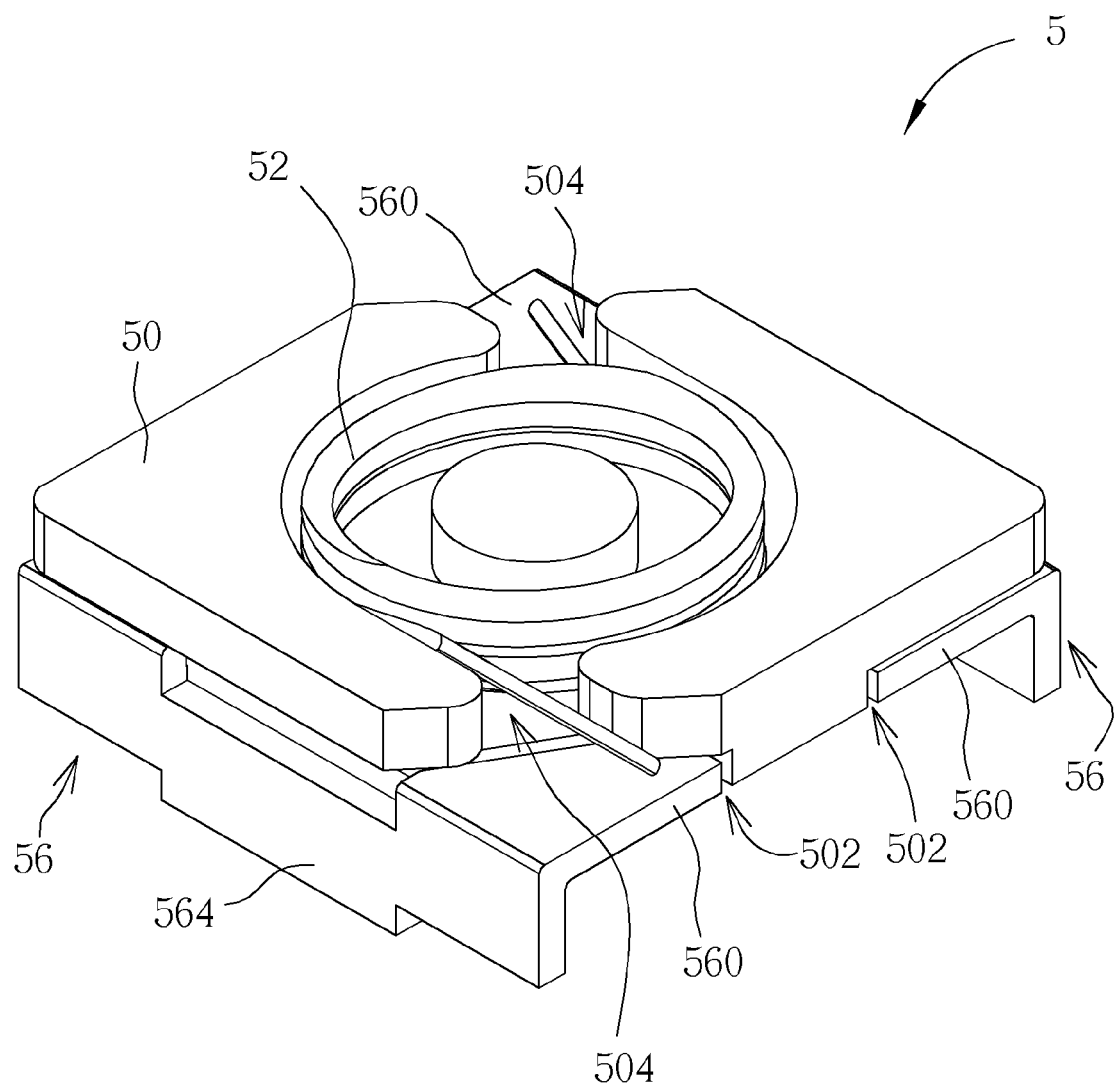
FIG. 9 is a perspective view illustrating the inductor shown in FIG. 4 without the second core.

Referring to FIGS. 4 to 9, FIG. 4 is a perspective view illustrating an inductor 5 according to another embodiment of the invention, FIG. 5 is an exploded view illustrating the inductor 5 shown in FIG. 4, FIG. 6 is a perspective view illustrating the inductor 5 shown in FIG. 4 from another view angle, FIG. 7 is an exploded view illustrating the inductor 5 shown in FIG. 6, FIG. 8 is a front view illustrating the inductor 5 shown in FIG. 4, and FIG. 9 is a perspective view illustrating the inductor 5 shown in FIG. 4 without the second core 54. As shown in FIGS. 4 to 9, the inductor 5 comprises a first core 50, a conducting wire 52, a second core 54 and two first lead frames 56. The first core 50 or the second core 54 may be made of iron powder, ferrite, permanent magnet or other magnetic materials. The shape of the first core 50 or the second core 54 is not limited to rectangular as shown in the figures and may be designed in other shapes, such as circular, oval-shaped, polygonal, and soon, according to practical applications. The conducting wire 52 may be a wire-wound coil wound by copper wire.

As shown in FIGS. 5 and 7, an accommodating space 500 is formed on a first side S1 of the first core 50 and four recess portions 502 are formed on a second side S2 of the first core 50, wherein the first side S1 is opposite to the second side S2. In this embodiment, the four recess portions 502 are formed on four corners of the first core 50 respectively, such that the area utilization ratio of the accommodating space 500 can be improved effectively. In this embodiment, each of the two first lead frames 56 has two opposite embedded portions 560 and a lead 564, wherein the lead 564 is extended from the embedded portion 560. In practical applications, the first lead frame 56 may be formed by forging process.

To assemble the inductor 5, the conducting wire 52 has to be disposed in the accommodating space 500 first. Afterward, the second sore 54 is disposed on the first side S1 of the first core 50 and covers the accommodating space 500. Then, the embedded portions 560 of each first lead frame 56 are embedded in the recess portions 502 on the second side S2 of the first core 50 correspondingly. In this embodiment, two holes 504 are formed on two opposite corners of the first core 50 respectively, so two opposite ends of the conducting wire 52 can pass through the holes 504 and be welded on the embedded portions 560 of the first lead frames 56 respectively (as shown in FIG. 9), so as to obtain high welding strength.

As shown in FIG. 8, the first core 50 has a first height H1' and the embedded portion 560 of the first lead frame 56 has a second height H2'. After embedding the embedded portion 560 of the first lead frame 56 in the recess portion 502 of the first core 50, a total height H0' of the embedded portion 560 and the first core 50 is smaller than a sum of the first height H1' and the second height H2'.

Figure 10:
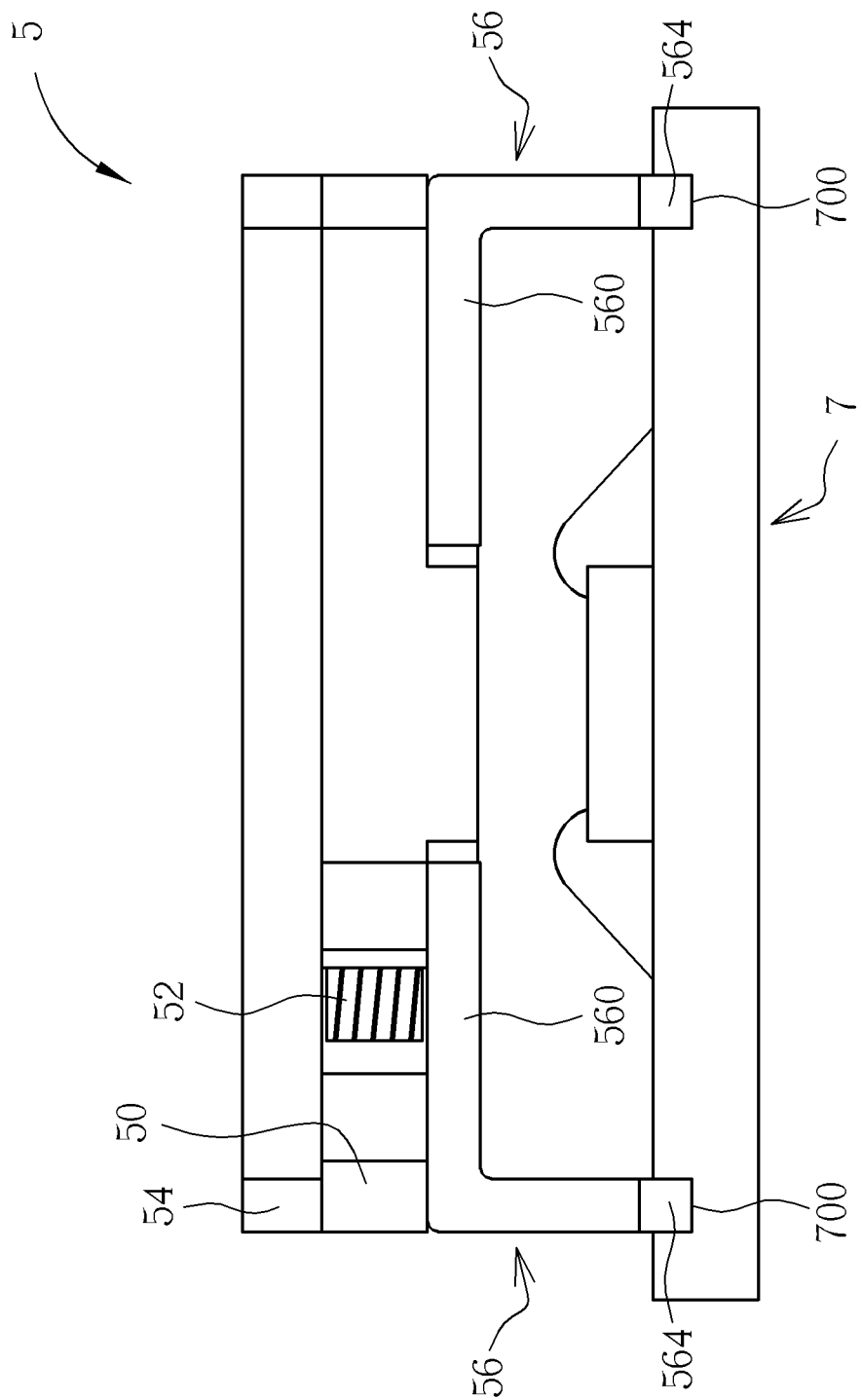
FIG. 10 is a schematic diagram illustrating an assembly of the inductor shown in FIG. 4 and an IC chip package structure.

Referring to FIG. 10, FIG. 10 is a schematic diagram illustrating an assembly of the inductor 5 shown in FIG. 4 and an IC chip package structure 7. As shown in FIG. 10, when the inductor 5 is integrated with the IC chip package structure 7 by system-in-package technology, the first lead frames 56 can be used to form an air bridge and connected to the IC chip package structure 7. As mentioned in the above, since the total height H0' of the embedded portion 560 and the first core 50 is smaller than a sum of the first height H1' of the first core 50 and the second height H2' of the embedded portion 560 and the conducting wire 52 is embedded in the accommodating space 500 of the first core 50, the invention can satisfy the requirement of inductance without increasing the height of the inductor 5 and can improve the connection between the IC chip package structure 7 and the inductor 5.

In this embodiment, the lead 564 of the first lead frame 56 is designed as T-shaped and extends downward so as to be connected to the IC chip package structure 7. As shown in FIG. 10, the recesses 700 corresponding to the leads 564 may be formed on the IC chip package structure 7. The leads 564 can be embedded and then welded in the recesses 700 so as to improve welding strength. However, in another embodiment, a lead of the IC chip package structure 7 may be extended upward so as to be connected to the lead frame 56. Furthermore, an external lead may be used to connect the first lead frame 56 of the inductor 5 and the IC chip package structure 7. In other words, the connecting manner between the first lead frame 56 and the IC chip package structure 7 may be designed based on practical applications and not limited to the embodiment shown in the figures.

Figure 11:
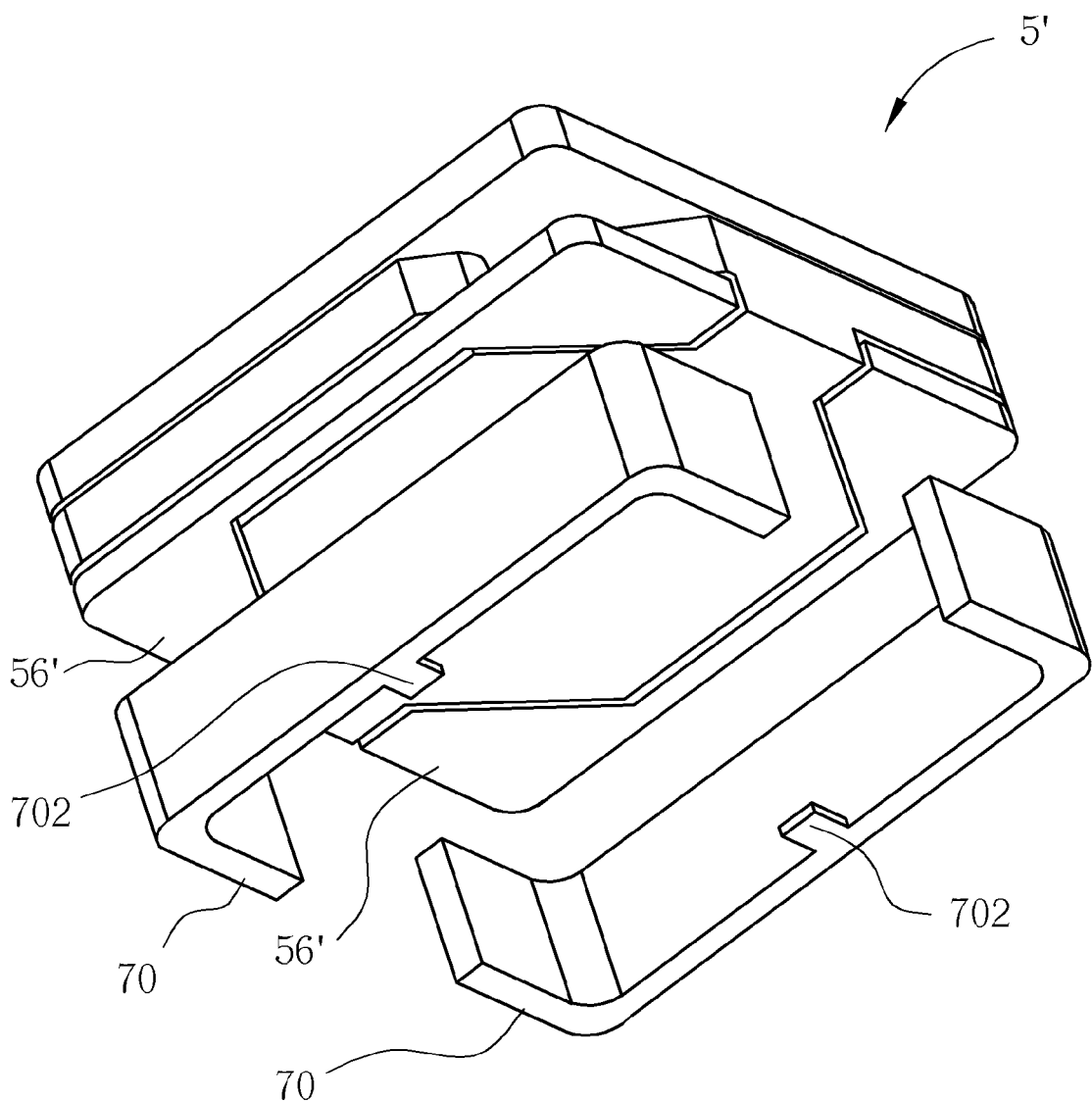
FIG. 11 is a schematic diagram illustrating an inductor and a second lead frame of an IC chip according to another embodiment of the invention.

Referring to FIG. 11, FIG. 11 is a schematic diagram illustrating an inductor 5' and a second lead frame 70 of an IC chip according to another embodiment of the invention. As shown in FIG. 11, the second lead frame 70 of an IC chip (not shown) can be extended toward the first lead frame 56' of the inductor 5' so as to be connected to the first lead frame 56'. In this embodiment, the second lead frame 70 comprises two opposite U-shaped lead frames. However, in another embodiment, the second lead frame 70 may be designed as ring-shaped. That is to say, the shape of the second lead frame 70 can be designed based on practical applications and not limited to the embodiment shown in the figure. Moreover, the second lead frame 70 has an electrical pad 702, which can be electrically connected to the IC chip. It should be noted that the second lead frame 70 may have more than one electrical pad 702 with sheet shape or other shapes and the electrical pad may be located at the middle, side or any position of the second lead frame 70. That is to say, the second lead frame 70 is not limited to the embodiment shown in FIG. 11.

It should be noted that the first core 10 shown in FIG. 2 can be replaced by the first core 50 shown in FIG. 5, the first core 50 shown in FIG. 5 can be also replaced by the first core 10 shown in FIG. 2, and it depends on practical applications.

Compared to the prior art, since the invention embeds the conducting wire into the core, the total height can be reduced effectively when the inductor is integrated with an IC chip by system-in-package technology. Accordingly, the electronic product equipped with the inductor of the invention can be adapted to a thin design. Furthermore, the inductor of the invention utilizes the lead frame to provide a platform for welding the conducting wire, so as to obtain high welding strength.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An inductor comprising:
   a first core having a first side and a second side opposite to the first side, comprising a pillar formed on the first side of the first core and a protrusion formed on the second side of the first core to form a first recess and a second recess along the edges of the second side of the first core;
   a conducting wire disposed around the pillar, wherein the conducting wire comprises a first end and a second end; and
   a first lead frame having a first portion and a second portion spaced apart from the first portion, wherein the first portion comprises a first embedded portion and the second portion comprises a second embedded portion;
   wherein the first embedded portion and the second embedded portion are embedded in the first recess and the second recess, respectively, wherein the first portion and the second portion of the first lead frame are electrically connected to the first end and the second end of the conducting wire, respectively.

2. The inductor of claim 1, wherein the first portion of the first lead frame further comprises a first welding platform connected to the first embedded portion, and the second portion of the first lead frame further comprises a second welding platform connected to the second embedded portion; and a first hole is formed on a first edge of the first core and a second hole is formed on a second edge of the first core, wherein the first end of the conducting wire passes through the first hole and is welded on the first welding platform, and the second end of the conducting wire sasses through the second hole and is welded on the second welding platform.

3. The inductor of claim 1, wherein a first hole is formed on a first corner of the first core, and a second hole is formed on a second corner of the first core.

4. The inductor of claim 1, further comprising a second core disposed over the first core.

5. The inductor of claim 1, wherein the inductor is adapted to be integrated with an integrated circuit chip by system-in-package technology, the integrated circuit chip comprises a second lead frame extending toward the first lead frame, such that the second lead frame is able to be electrically connected to the first lead frame.

6. The inductor of claim 1, wherein the pillar is surrounded by at least one protrusions formed on the first side of the first core to form an accommodating space to accommodate the conducting.

7. The inductor of claim 1, wherein the first core is T-shaped or I-shaped.

8. The inductor of claim 1, wherein the first portion of first lead frame comprises a lead extended in a direction that is substantially perpendicular to the first embedded portion of the first lead frame.

9. An inductor comprising:
a first core having a first side and a second side opposite to the first side, a recess portion being formed on the second side of the first core, a hole being formed on an edge of the first core;
a second core disposed on the first side of the first core; a conducting wire disposed between the first core and the second core; and
a first lead frame having an embedded portion and a welding platform, the embedded portion being embedded in the recess portion, the welding platform being connected to the embedded portion, one end of the conducting wire passing through the hole and being welded on the welding platform.

10. The inductor of claim 9, wherein the first core has a first height, the embedded portion has a second height, after embedding the embedded portion in the recess portion, a total height of the embedded portion and the first core is smaller than a sum of the first height and the second height.

11. The inductor of claim 9, wherein the inductor is adapted to be integrated with an integrated circuit chip by system-in-package technology, the integrated circuit chip comprises a second lead frame extending toward the first lead frame, such that the second lead frame is able to be electrically connected to the first lead frame.

12. The inductor of claim 9, wherein a protruding portion protrudes from the first side of the first core, and the conducting wire is disposed around the protruding portion.

13. The inductor of claim 9, wherein the first core is T-shaped or I-shaped.

14. The inductor of claim 9, wherein the first lead frame is embedded in the recess portion and the first core.

15. An inductor comprising:
a first core having a first side and a second side opposite to the first side, a pillar being formed on the first side of the first core;
a conducting wire disposed around the pillar, wherein the conducting wire comprises a first end and a second end; and
a first lead frame having a first portion and a second portion spaced apart from the first portion;
wherein the first portion and the second portion of the first lead frame are disposed along two opposite edges of the second side of the first core and electrically connected to the first end and the second end of the conducting wire, respectively.

16. The inductor of claim 15, wherein the first core has a first height, the first embedded portion has a second height, after embedding the first embedded portion in the recess portion, a total height of the first embedded portion and the first core is smaller than a sum of the first height and the second height.

17. The inductor of claim 15, wherein the inductor is adapted to be integrated with an integrated circuit chip by system-in-package technology, the integrated circuit chip comprises a second lead frame extending toward the first lead frame, such that the second lead frame is able to be electrically connected to the first lead frame.

18. The inductor of claim 15, further comprising a second core disposed over the first core.

19. The inductor of claim 15, wherein the first core is T-shaped or I-shaped.

20. The inductor of claim 15, wherein each of the first portion and the second portion of the first lead frame comprises a lead in a T-shaped form extended in a direction that is substantially perpendicular to the second side of the first core.

* * * * *